United States Patent
Park et al.

(10) Patent No.: US 10,163,838 B2
(45) Date of Patent: Dec. 25, 2018

(54) SEMICONDUCTOR DEVICE

(71) Applicant: SAMSUNG ELECTRONICS CO., LTD., Suwon-si, Gyeonggi-do (KR)

(72) Inventors: Soojeoung Park, Hwaseong-si (KR); Bona Baek, Seoul (KR); Yongho Kim, Daegu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/499,272

(22) Filed: Apr. 27, 2017

(65) Prior Publication Data
US 2018/0108633 A1   Apr. 19, 2018

(30) Foreign Application Priority Data
Oct. 14, 2016   (KR) .................. 10-2016-0133793

(51) Int. Cl.
*H01L 23/00*   (2006.01)

(52) U.S. Cl.
CPC .............. *H01L 24/13* (2013.01); *H01L 24/05* (2013.01); *H01L 24/06* (2013.01); *H01L 24/14* (2013.01); *H01L 2224/0401* (2013.01); *H01L 2224/05012* (2013.01); *H01L 2224/0612* (2013.01); *H01L 2224/13012* (2013.01); *H01L 2224/1412* (2013.01); *H01L 2224/14104* (2013.01)

(58) Field of Classification Search
CPC . H01L 2224/05022; H01L 2224/13012; H01L 24/14; H01L 24/05; H01L 24/17; H01L 24/06; H01L 23/3171
See application file for complete search history.

(56) References Cited

U.S. PATENT DOCUMENTS

| | | | |
|---|---|---|---|
| 8,207,608 B2 | 6/2012 | Chew et al. | |
| 8,233,288 B2 | 7/2012 | Tokii | |
| 8,546,941 B2 | 10/2013 | Chen et al. | |
| 8,598,691 B2 | 12/2013 | Wu et al. | |
| 8,846,519 B2 | 9/2014 | Chew et al. | |
| 8,847,391 B2 | 9/2014 | Bao et al. | |
| 9,093,332 B2 | 7/2015 | Kuo et al. | |

(Continued)

FOREIGN PATENT DOCUMENTS

| | | |
|---|---|---|
| JP | H10-189608 A | 7/1998 |
| JP | H11-186318 A | 7/1999 |

(Continued)

*Primary Examiner* — A. Sefer
(74) *Attorney, Agent, or Firm* — Volentine, Whitt & Francos, PLLC

(57) ABSTRACT

A semiconductor device includes a semiconductor chip, pads provided on the semiconductor chip, and insulating patterns provided on the semiconductor chip. The insulating patterns having openings exposing the pads, and conductive patterns are provided in the openings and coupled to the pads. When viewed in a plan view, two opposite ends of the pads are spaced apart from the conductive patterns and two opposite ends of the conductive patterns are spaced apart from the pads. Additionally, when viewed in a plan view, the conductive patterns include a first conductive pattern whose length is parallel to a first direction and a second conductive pattern whose length is parallel to a second direction. The first and second directions are oblique to each other.

16 Claims, 12 Drawing Sheets

(56) References Cited

U.S. PATENT DOCUMENTS

| | | |
|---|---|---|
| 9,105,530 B2 | 8/2015 | Lin et al. |
| 9,111,817 B2 | 8/2015 | Chen et al. |
| 2004/0007779 A1* | 1/2004 | Arbuthnot ............... H01L 24/11 257/780 |
| 2008/0088013 A1* | 4/2008 | Chew ..................... H01L 24/03 257/735 |
| 2011/0215467 A1* | 9/2011 | Hsu ....................... H01L 23/498 257/737 |
| 2013/0292819 A1 | 11/2013 | Huang et al. |
| 2014/0252635 A1* | 9/2014 | Tran ....................... H01L 24/05 257/773 |
| 2015/0048499 A1 | 2/2015 | Tai et al. |
| 2015/0262952 A1 | 9/2015 | Lee et al. |
| 2016/0148888 A1* | 5/2016 | Ryu ....................... H01L 24/14 257/621 |

FOREIGN PATENT DOCUMENTS

| | | | |
|---|---|---|---|
| JP | 2001-176905 A | | 6/2001 |
| JP | 2001-358165 A | | 12/2001 |
| TW | 2008-37912 | * | 9/2008 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2016-0133793, filed on Oct. 14, 2016, in the Korean Intellectual Property Office, the entire contents of which are hereby incorporated by reference.

BACKGROUND OF THE INVENTION

The present disclosure relates to a semiconductor device, and in particular, to a bump stack of a semiconductor device.

There is an increasing demand for semiconductor devices with many pins and a small pitch. Accordingly, many studies are being conducted to scale down a semiconductor device. A semiconductor device has an electric connection structure (e.g., a solder ball or a solder bump) to be electrically connected to another electronic device or a printed circuit board. It is necessary to develop a technology aimed at improving reliability and stability of the electric connection structure of the semiconductor device.

SUMMARY

Some embodiments of the disclosure provide a highly-reliable semiconductor device and a semiconductor package including the same.

Some embodiments of the disclosure provide a highly-scaled semiconductor device.

According to some embodiments of the disclosure, a semiconductor device may include a semiconductor chip, a pad provided on the semiconductor chip, an insulating pattern provided on the semiconductor chip and having an opening exposing the pad, and a conductive pattern provided on the insulating pattern. The pad may have two opposite ends that are spaced apart from the conductive pattern, when viewed in a plan view, and the conductive pattern may have two opposite ends that are spaced apart from the pad. A pattern size of the conductive pattern in a direction of its length may be 1.7-3 times that in a direction of its width.

According to some embodiments of the disclosure, a semiconductor device may include a substrate, a first bump stack provided on a surface of the substrate and including a first pad and a first conductive pattern on the first pad, and a second bump stack provided on the surface of the substrate and including a second pad and a second conductive pattern on the second pad. A width of the first pad may be larger than a width of the first conductive pattern, a length of the first conductive pattern may be larger than a length of the first pad, and a width of the second conductive pattern may be larger than a width of the second pad. Width directions of the first and second conductive patterns may be parallel to a first direction.

According to some embodiments of the disclosure, a semiconductor device may include a semiconductor chip, pads provided on the semiconductor chip, insulating patterns provided on the semiconductor chip and having openings exposing the pads, and conductive patterns provided in the openings and coupled to the pads. When viewed in a plan view, two opposite ends of the pads may be spaced apart from the conductive patterns and two opposite ends of the conductive patterns may be spaced apart from the pads. Also, when viewed in a plan view, the conductive patterns may include a first conductive pattern whose long axis is parallel to a first direction and a second conductive pattern whose long axis is parallel to a second direction, and the first and second directions may be oblique to each other.

According to some embodiments of the disclosure, a semiconductor device includes a semiconductor chip. A pad is provided on the semiconductor chip for communicating an electrical signal between a first electrical component of the semiconductor chip and a second electrical component external to the semiconductor chip. An insulating pattern is provided on the semiconductor chip, the insulating pattern having an opening exposing a central portion of the pad. A conductive pattern is provided on the insulating pattern and formed such that the longitudinal axis of the conductive pattern is perpendicular to the longitudinal axis of the pad and the length of the conductive pattern along its longitudinal axis is about 1.7-3 times the width of the conductive pattern, which is parallel to the longitudinal axis of the pad. And the conductive pattern completely overlaps the exposed central portion of the pad.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

A semiconductor device according to some embodiments of the disclosure and a semiconductor package therewith will be described.

Figure 1A:
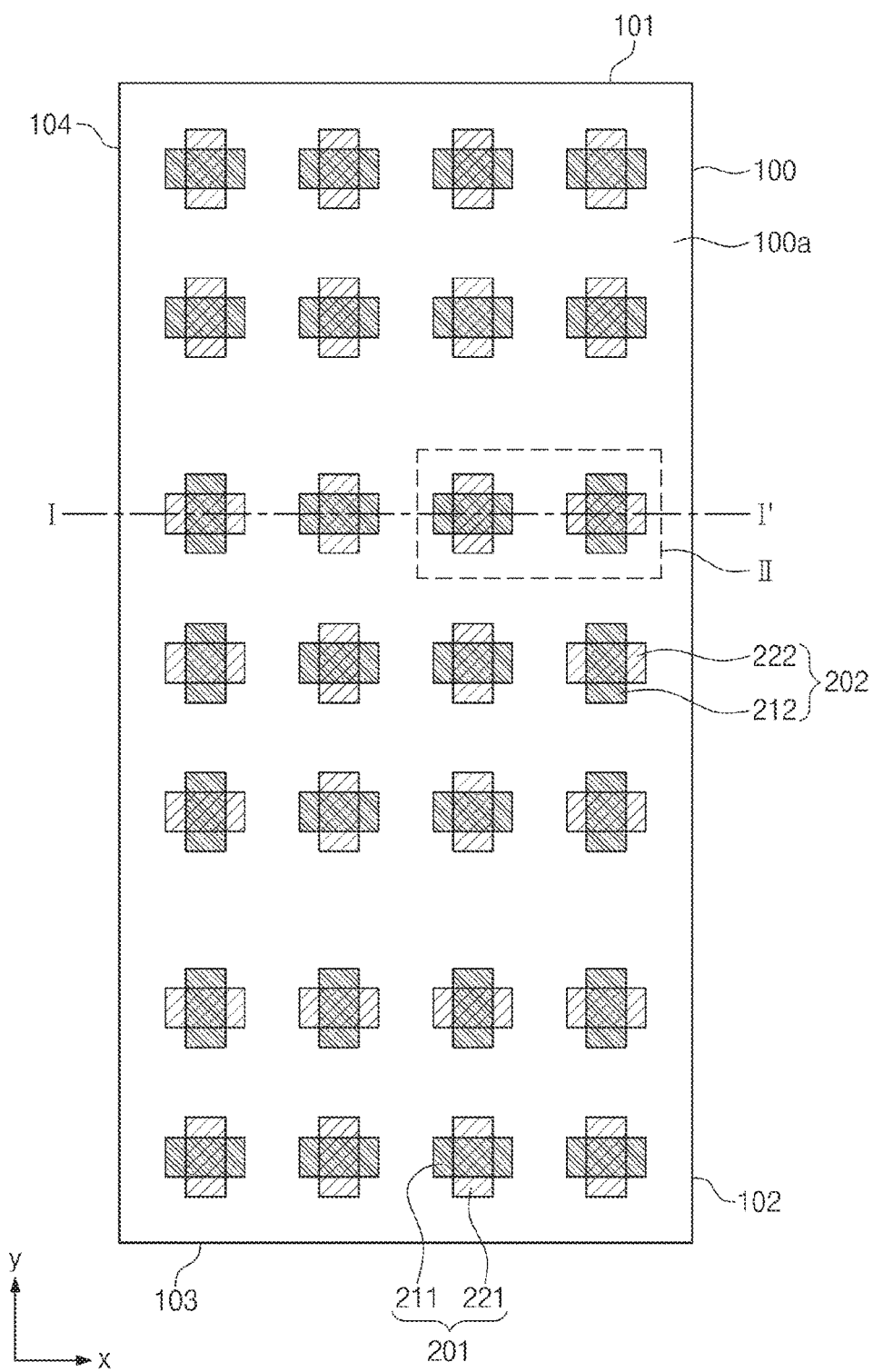
FIG. 1A is a plan view illustrating a semiconductor device according to some embodiments of the disclosure.
Figure 1B:
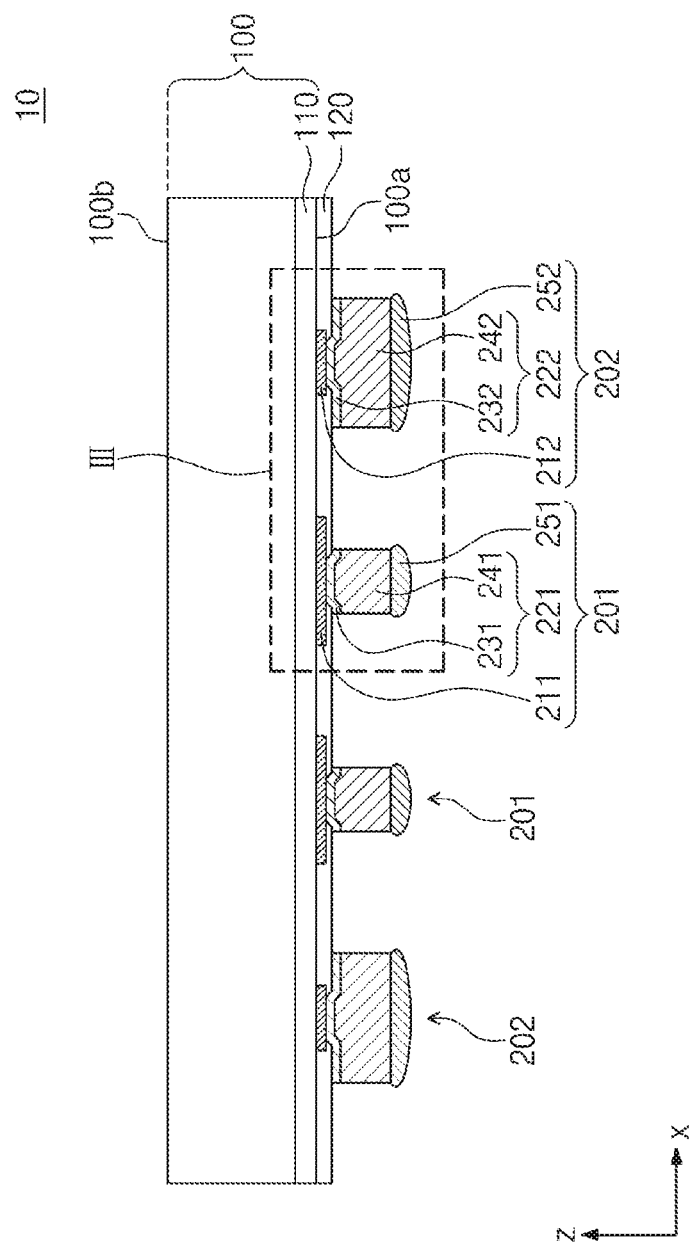
FIG. 1B is a sectional view taken along line I-I' of FIG. 1A.

FIG. 1A is a plan view illustrating a semiconductor device according to some embodiments of the disclosure. FIG. 1B is a sectional view taken along line I-I' of FIG. 1A.

Referring to FIGS. 1A and 1B, a semiconductor device 10 may include a semiconductor substrate 100 and bump stacks 201 and 202. The semiconductor device 10 may be a memory chip, a logic chip, or a semiconductor chip including both memory and logic elements. The semiconductor substrate 100 may be formed of or include silicon, germanium, or silicon-germanium. The semiconductor substrate 100 may have a first surface 100a and a second surface 100b facing each other. The semiconductor substrate 100 may include a circuit layer 110.

The bump stacks 201 and 202 may be provided on the first surface 100a of the semiconductor substrate 100. The bump stacks 201 and 202 may be electrically connected to integrated devices (not shown) that are provided in the circuit layer 110. In the present specification, the expression "electrically connected or coupled" may mean that a plurality of elements is directly connected/coupled to each other or are indirectly connected or coupled to each other via another conductive element. Also, the expression "an element is electrically connected or coupled to the circuit layer 110" may mean that the element is electrically connected or coupled to integrated devices provided in the circuit layer 110. The bump stacks 201 and 202 may be used as paths for receiving or sending electrical signals from or to the semiconductor device 10. The bump stacks 201 and 202 may include a first bump stack 201 and a second bump stack 202 which are spaced apart from each other. The first bump stack 201 may include a first pad 211 and a first conductive pattern 221, and the second bump stack 202 may include a second pad 212 and a second conductive pattern 222. The pads 211 and 212 may be provided on the first surface 100a of the semiconductor substrate 100. The pads 211 and 212 may include a conductive material (e.g., aluminum or copper). When viewed in a plan view, a center portion of the first pad 211 may be overlapped with a center portion of the first conductive pattern 221 but two opposite ends of the first pad 211 may not be overlapped with the first conductive pattern 221. The center portion of the first pad 211 may be provided between two opposite ends of the first pad 211. A first direction x and a second direction y may be parallel to the first surface 100a of the semiconductor substrate 100. The first and second directions x and y may be oblique to each other. A third direction z may be substantially perpendicular to the first surface 100a of the semiconductor substrate 100. When viewed in a plan view, a long axis of the first conductive pattern 221 may be parallel to the first direction x and a short axis of the first conductive pattern 221 may be parallel to the second direction y.

As mentioned above, the second bump stack 202 may include the second pad 212 and the second conductive pattern 222. When the second bump stack 202 is rotated by 90 degrees, the second bump stack 202 may have substantially the same planar shape as the first bump stack 201. A long axis of the second conductive pattern 222 may be parallel to the second direction y. Two opposite ends of the second conductive pattern 222 may not be overlapped with the second pad 212. Two opposite ends of the second pad 212 may not be overlapped with the second conductive pattern 222.

As shown in FIG. 1B, the conductive patterns 221 and 222 may include under-bump patterns 231 and 232 and pillar patterns 241 and 242. Although not shown, each of the under-bump patterns 231 and 232 may include a barrier pattern and a seed pattern. The barrier pattern may be formed of or include titanium, tungsten, chromium, or alloys thereof. The seed pattern may be formed of or include copper, nickel, or alloys thereof. The pillar patterns 241 and 242 may be provided on the under-bump patterns 231 and 232. The pillar patterns 241 and 242 may be formed of a copper-containing material. A first solder pattern 251 and a second solder pattern 252 may be provided on bottom surfaces of the first and second conductive patterns 221 and 222, respectively.

Figure 2:
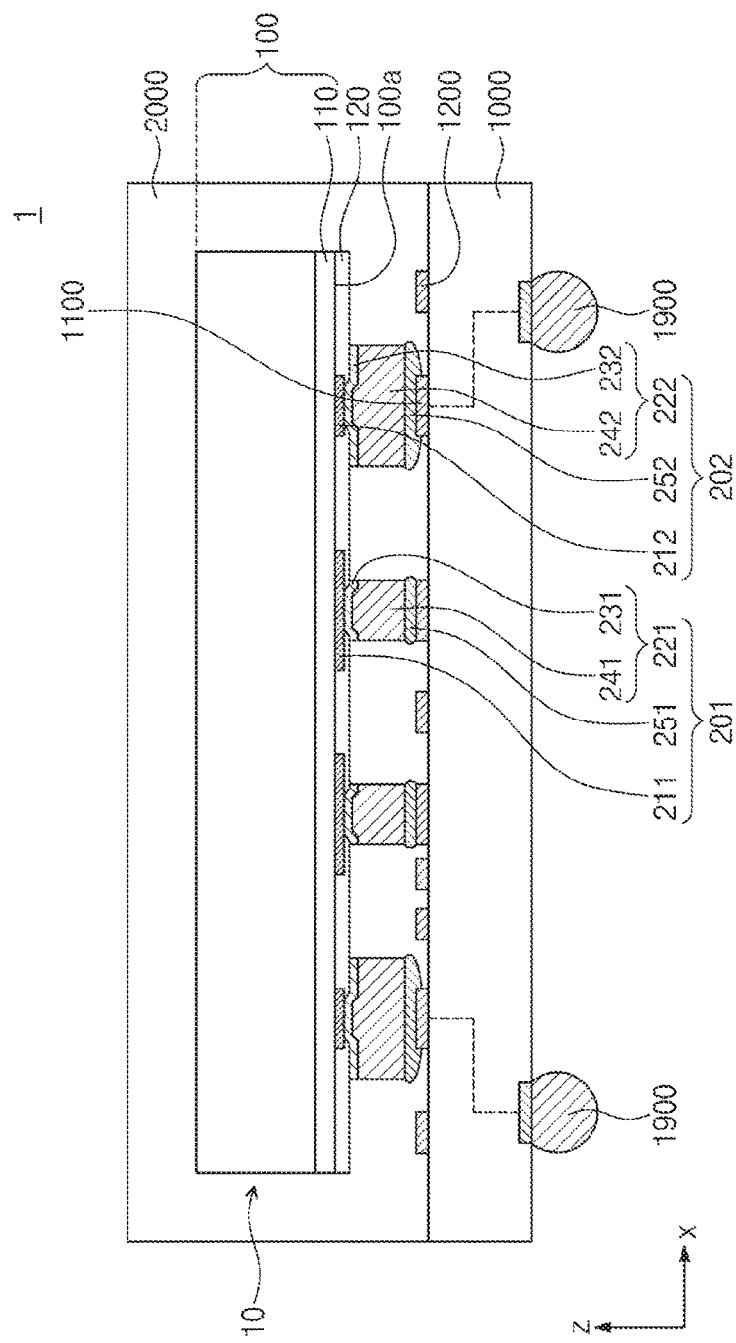
FIG. 2 is a sectional view illustrating a semiconductor package according to some embodiments of the disclosure.

FIG. 2 is a sectional view illustrating a semiconductor package according to some embodiments of the disclosure. For concise description, a previously described element may be identified by a similar or identical reference number without repeating an overlapping description thereof.

Referring to FIG. 2, a semiconductor package 1 may include a package substrate 1000, in addition to the semiconductor device 10. For example, the package substrate 1000 may include a printed circuit board. Conductive pads 1100 may be provided on a top surface of the package substrate 1000. An outer terminal 1900 may be provided on a bottom surface of the package substrate 1000. The conductive pads 1100 may be electrically connected to the outer terminals 1900 via the package substrate 1000 as illustrated by a dotted line. The semiconductor device 10 may be configured to have substantially the same features as the semiconductor device 10 described with reference to FIGS. 1A and 1B. The semiconductor device 10 may be mounted on the package substrate 1000. The semiconductor device 10 may be provided in such a way that the first surface 100a faces the top surface of the package substrate 1000. The bump stacks 201 and 202 may be connected to the conductive pads 1100 by a reflow process, and thus, the semiconductor device 10 may be electrically connected to the package substrate 1000. The bump stacks 201 and 202 may be interposed between the package substrate 1000 and the semiconductor device 10. A molding pattern 2000 may be provided on the top surface of the package substrate 1000 to cover the semiconductor device 10. The molding pattern 2000 may be extended to fill a gap between the package substrate 1000 and the semiconductor device 10, thereby hermetically encapsulating the bump stacks 201 and 202. Hereinafter, the bump stacks 201 and 202 will be described in more detail.

Figure 3A:
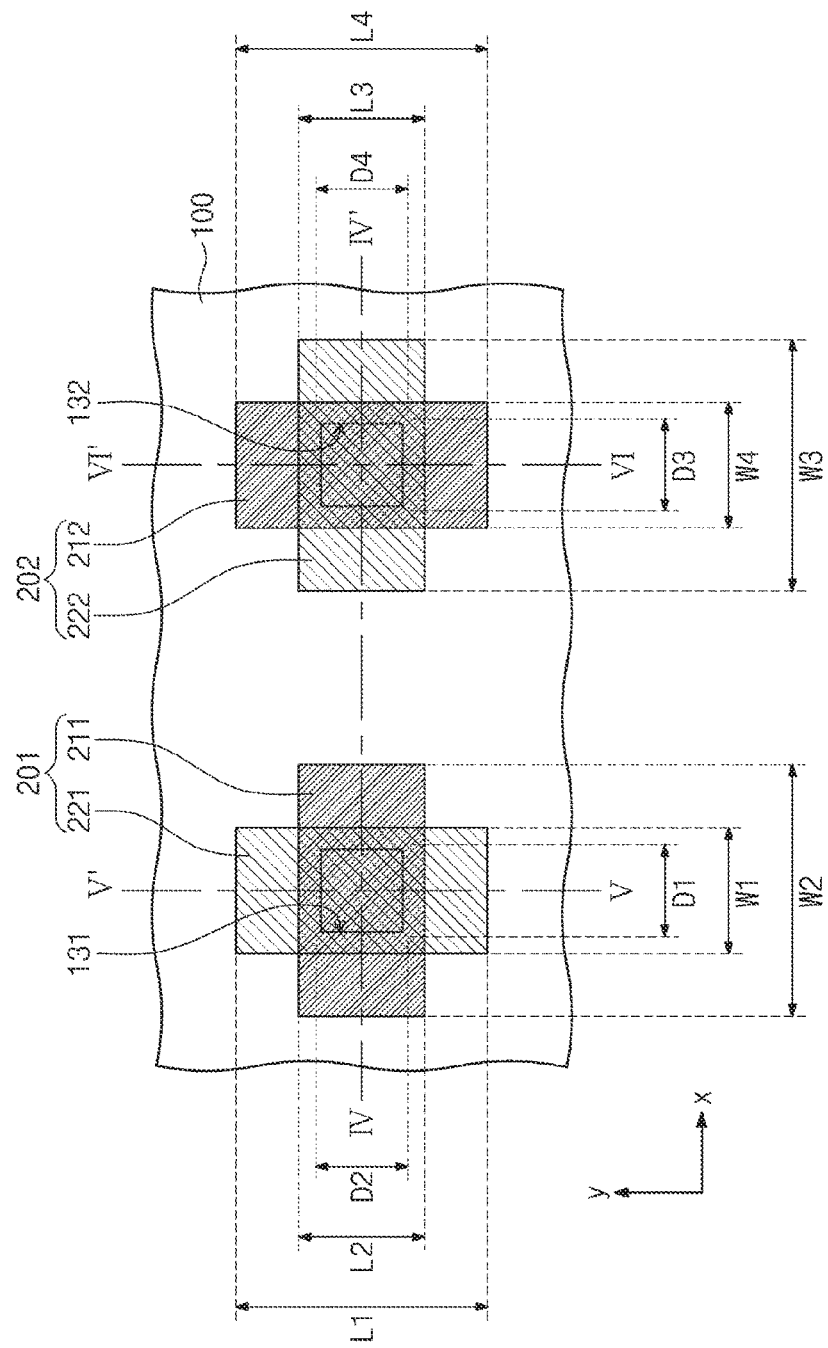
FIG. 3A is a plan view illustrating bump stacks according to some embodiments of the disclosure.
Figure 3B:
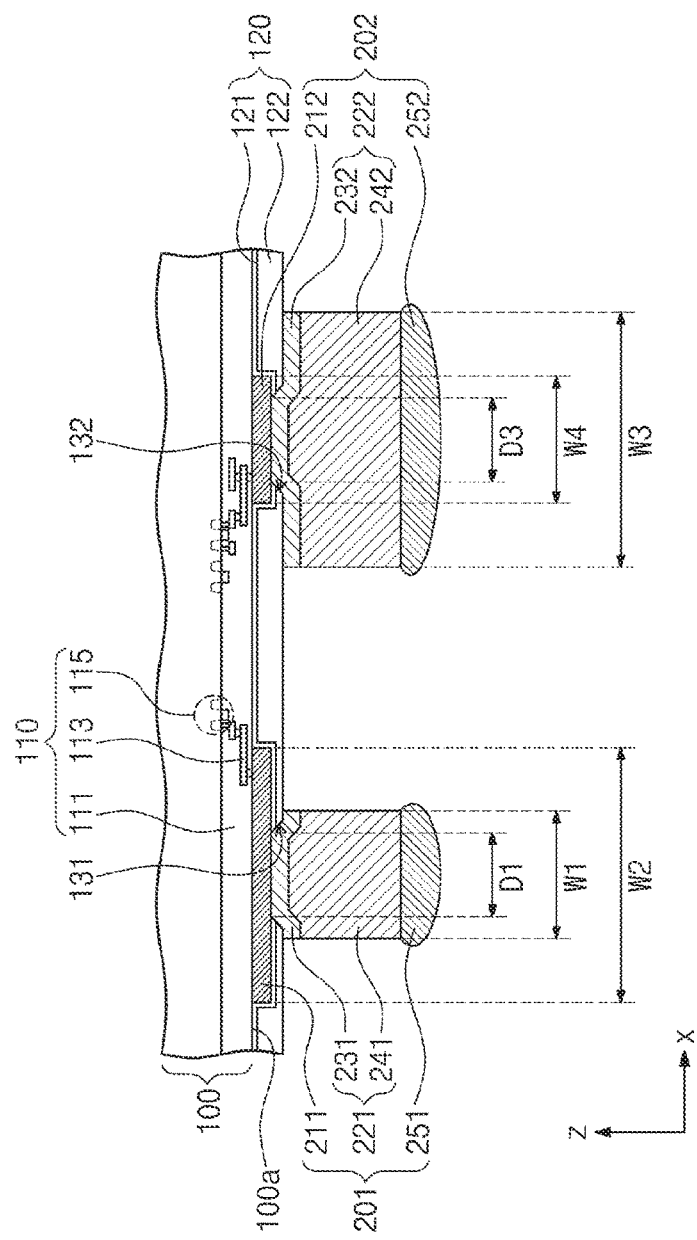
FIG. 3B is a sectional view taken along line IV-IV' of FIG. 3A.
Figure 3C:
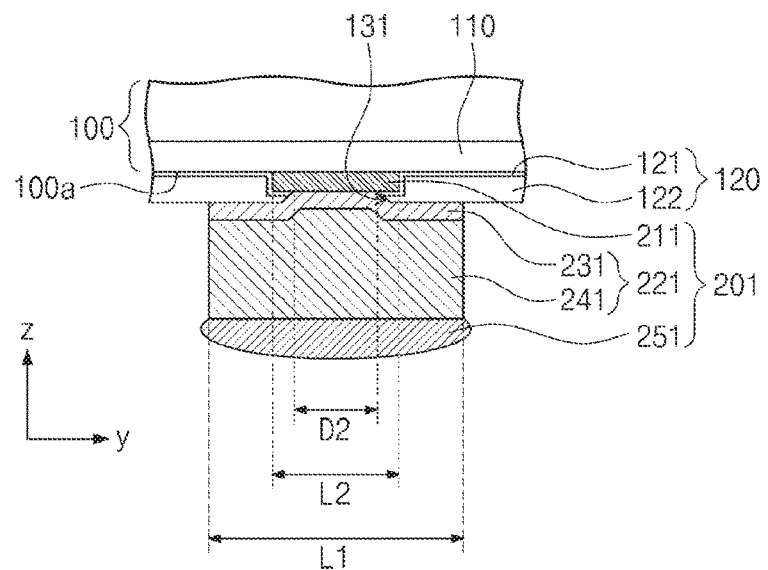
FIG. 3C is a sectional view taken along line V-V' of FIG. 3A.
Figure 3D:
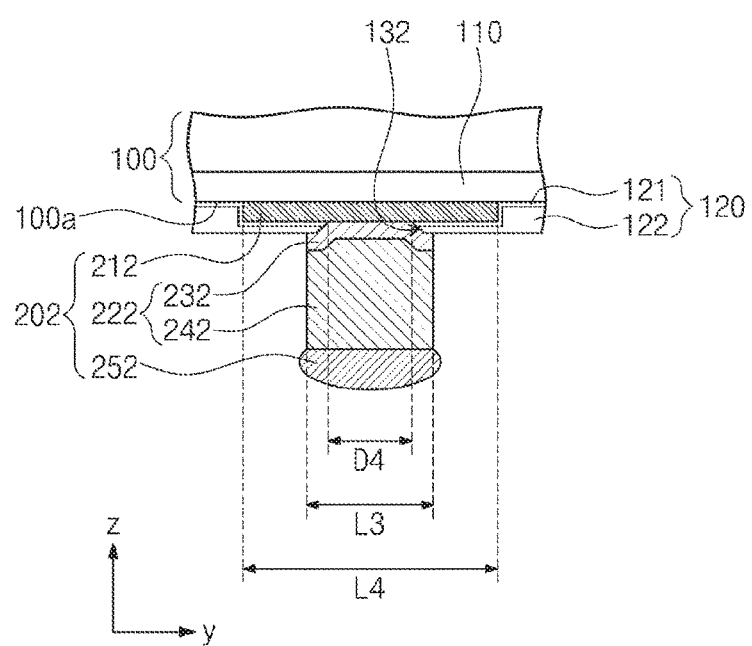
FIG. 3D is a sectional view taken along line VI-VI' of FIG. 3A.

FIG. 3A is a plan view illustrating bump stacks according to some embodiments of the disclosure. For example, FIG. 3A may be a plan view of a region II of FIG. 1A. FIG. 3B is a sectional view that is taken along line IV-IV' of FIG. 3A and illustrates an enlarged section of a region III of FIG. 1B. FIG. 3C is a sectional view taken along line V-V' of FIG. 3A. FIG. 3D is a sectional view taken along line VI-VI' of FIG. 3A. For concise description, a previously described element may be identified by a similar or identical reference number without repeating an overlapping description thereof.

Referring to FIGS. 3A and 3B, the semiconductor device 10 may include the semiconductor substrate 100, an insulating pattern 120, and the bump stacks 201 and 202. The semiconductor substrate 100 may include the circuit layer 110. The circuit layer 110 may include an insulating layer 111, integrated devices 115, and internal lines 113, and here, the integrated devices 115 and the internal lines 113 may be provided in the insulating layer 111. The integrated devices 115 may include, for example, transistors. The first bump stack 201 may include the first pad 211, first conductive patterns 221, and first solder patterns 251. The second bump stack 202 may include the second pad 212, the second conductive patterns 222, and the second solder pattern 252. The first and second pads 211 and 212 may be provided on a bottom surface of the circuit layer 110. The pads 211 and 212 may be formed of or include a conductive material (e.g., aluminum). The pads 211 and 212 may be electrically connected to the integrated devices 115 via the internal lines 113.

The insulating pattern 120 may be provided on the semiconductor substrate 100, the first pad 211, and the second pad 212. The insulating pattern 120 may cover two opposite ends of the first pad 211 and two opposite ends of the second pad 212. The insulating pattern 120 may contribute to reduce a stress to be applied to two opposite ends of each of the first and second pads 211 and 212. The insulating pattern 120 may include a first insulating pattern 121 and a second insulating pattern 122. The first insulating pattern 121 may be formed of or include silicon oxide, silicon nitride, or silicon oxynitride. The second insulating pattern 122 may be provided on the first insulating pattern 121. The second insulating pattern 122 may be formed of or include a polymer (e.g., polyimide). The insulating pattern 120 may be provided to have a first opening 131 and a second opening 132. The first opening 131 and the second opening 132 may be provided to expose the first pad 211 and the second pad 212, respectively. For example, the openings 131 and 132 in the first insulating pattern 121 and the openings 131 and 132 in the second insulating pattern 122 may be formed by a single process (e.g., by a single etching process). Inner side surfaces of the openings 131 and 132 in the first insulating pattern 121 may be respectively extended from inner side surfaces of the openings 131 and 132 in the second insulating pattern 122.

The first conductive pattern 221 may include a first under-bump pattern 231 and a first pillar pattern 241. The first under-bump pattern 231 may be provided on a bottom surface of the insulating pattern 120 and in the first opening 131. The first under-bump pattern 231 may be coupled to the first pad 211. The first pillar pattern 241 may be provided on the first under-bump pattern 231. The first pillar pattern 241 may be overlapped with the first under-bump pattern 231, when viewed in a plan view. The first pillar pattern 241 may be aligned to the first under-bump pattern 231 in the third direction z.

As shown in FIGS. 3A and 3B, a width W2 of the first pad 211 may be greater than a width W1 of the first conductive pattern 221. In the present specification, a width of an element may be a pattern size of the element in the first direction x, and a length of an element may be a pattern size of the element in the second direction y. A pattern size of an element may be the largest pattern size of the element in a chosen direction. The width W1 of the first conductive pattern 221 may be substantially equal to those of the first under-bump pattern 231 and the first pillar pattern 241. In the case where the width W2 of the first pad 211 is less than 110% of the width W1 of the first conductive pattern 221 and there is a process failure (e.g., misalignment of a mask pattern) in a process of forming the first opening 131, the first pad 211 may not be exposed by the first opening 131. In addition, during a process of fabricating or operating the semiconductor device 10, the circuit layer 110 may be damaged by a mechanical stress. For example, a crack may be formed in the circuit layer 110, thereby causing damage to the internal lines 113 or the integrated devices 115. In the case where the width W2 of the first pad 211 is larger than 150% of the width W1 of the first conductive pattern 221, an occupying area of the semiconductor device 10 may be increased. In some embodiments, the width W2 of the first pad 211 may be about 110%-150% of the width W1 of the first conductive pattern 221. Since the first pad 211 absorbs a mechanical stress, it may be possible to prevent or suppress the circuit layer 110 from being damaged by the mechanical stress. Furthermore, the process failure or the misalignment of the first opening 131 may be prevented and thus the first conductive pattern 221 may be well connected to the first pad 211. Accordingly, the semiconductor device 10 may be scaled down. In the first direction x, a pattern size D1 of the first opening 131 may be less than the width W2 of the first pad 211 and the width W1 of the first conductive pattern 221. Even if there is a process failure, the first opening 131 may be formed to expose the first pad 211.

Referring to FIGS. 3A and 3C in conjunction with FIG. 2, a length L1 of the first conductive pattern 221 may be larger than a length L2 of the first pad 211. The length L1 of the first conductive pattern 221 may be substantially equal to lengths of the first under-bump pattern 231 and the first pillar pattern 241. In the case where the length L1 of the first conductive pattern 221 is less than 110% of the length L2 of the first pad 211, there may occur a failure in electrical connection between the first bump stack 201 and a corresponding one of the conductive pads 1100 of the package substrate 1000 of FIG. 2. As an example, during a reflow process, a non-wetting issue may occur between the first bump stack 201 and one of the conductive pads 1100. As another example, during an operation of the semiconductor package 1, the circuit layer 110 may be damaged by a mechanical stress. In the case where the length L1 of the first conductive pattern 221 is greater than 150% of the length L2 of the first pad 211, an occupying area of the semiconductor device 10 may be increased. In some embodiments, the length L1 of the first conductive pattern 221 may be about 110%-150% of the length L2 of the first pad 211. The first bump stack 201 may be robustly connected to one of the conductive pads 1100 of the package substrate 1000 of FIG. 2. The semiconductor device 10 may be scaled down.

When measured in the second direction y, a pattern size D2 of the first opening 131 may be less than the length L2 of the first pad 211 and the length L1 of the first conductive pattern 221. The insulating pattern 120 may be provided to cover two opposite ends of the first pad 211 and protect the first pad 211. The length L2 of the first pad 211 is illustrated to be larger than the width W2 of the first pad 211, but in certain embodiments, the length L2 of the first pad 211 may be substantially equal to the width W2 of the first pad 211.

The second conductive pattern 222 may include a second under-bump pattern 232 and a second pillar pattern 242. The second conductive pattern 222 may be similar to the first conductive pattern 221. For example, the second under-bump pattern 232 and the second pillar pattern 242 may be formed of or include the same material as the first under-bump pattern 231 and the first pillar pattern 241. The second under-bump pattern 232 may be provided on the insulating pattern 120 and in the second opening 132. The second under-bump pattern 232 may be coupled to the second pad 212. The second pillar pattern 242 may be provided on the second under-bump pattern 232 and may be aligned to the second under-bump pattern 232 in the third direction z.

When the second conductive pattern 222 is rotated by 90 degrees, the second conductive pattern 222 may have substantially the same planar shape as the first conductive pattern 221. For example, a width W3 of the second conductive pattern 222 may be substantially equal to the length L1 of the first conductive pattern 221, and a length L3 of the second conductive pattern 222 may be substantially equal to the width W1 of the first conductive pattern 221. A width W4 of the second pad 212 may be substantially equal to the length L2 of the first pad 211, and a length L4 of the second pad 212 may be substantially equal to the width W2 of the first pad 211. In the present specification, the equality in terms of length or width means that a difference between two lengths or widths is within a process tolerance in a fabrication process and such a difference is not intended.

As shown in FIGS. 3A and 3B, the width W3 of the second conductive pattern 222 may be larger than the width W4 of the second pad 212. The width W3 of the second conductive pattern 222 may be substantially equal to those of the second under-bump pattern 232 and the second pillar pattern 242. For example, the width W3 of the second conductive pattern 222 may be about 110%-150% of the width W4 of the second pad 212. Since the second pad 212 absorbs a mechanical stress, it may be possible to prevent or suppress the circuit layer 110 from being damaged. The semiconductor device 10 may be scaled down. In the first direction x, a pattern size D3 of the second opening 132 may be less than the width W3 of the second conductive pattern 222 and the width W4 of the second pad 212. Even if there is a process failure in a process of forming the second opening 132, the second opening 132 may be formed to expose the second pad 212. Accordingly, the second conductive pattern 222 may be well connected to the second pad 212.

As shown in FIGS. 3A and 3D, the length L3 of the second conductive pattern 222 may be substantially equal to lengths of the second under-bump pattern 232 and the second pillar pattern 242. The length L4 of the second pad 212 may be larger than the length L3 of the second conductive pattern 222. For example, the length L4 of the second pad 212 may be about 110%-150% of the length L3 of the second conductive pattern 222. Accordingly, the semiconductor substrate 100 may be stably connected to the package substrate 1000 of FIG. 2 by the second bump stack 202, and the semiconductor substrate 100 may be scaled down. In the second direction y, a pattern size D4 of the second opening 132 may be less than the length L3 of the second conductive pattern 222 and the length L4 of the second pad 212.

A pattern size of each of the conductive patterns 221 and 222 in a direction of its long axis may be 1.7-3 (e.g., 2) times that in a direction of its short axis. For example, the length L1 of the first conductive pattern 221 may be 1.7-3 times the width W1 of the first conductive pattern 221. The width W3 of the second conductive pattern 222 may be 1.7-3 times the length L3 of the second conductive pattern 222. In some embodiments, a pattern size of each of the conductive patterns 221 and 222 in its long axis direction may be about 2 times that in its short axis direction. In the case where a pattern size of each of the conductive patterns 221 and 222 in its long axis direction is less than 1.7 times that in its short axis direction, there may occur a failure in connecting the bump stacks 201 and 202 to the conductive pads 1100 of the package substrate 1000. In addition, during a process of fabricating or operating the semiconductor device 10, the circuit layer 110 may be damaged by a mechanical stress. By contrast, in the case where a pattern size of each of the conductive patterns 221 and 222 in its long axis direction is larger than 3 times that in its short axis direction, a short circuit may be formed between the conductive patterns 221 and 222 or an occupying area of the semiconductor device 10 may be increased. In some embodiments, each of the conductive patterns 221 and 222 may be configured to allow a ratio between its long and short pattern sizes to be within an allowable range, and this may make it possible to prevent or suppress the circuit layer 110 from being damaged. As a result, the bump stacks 201 and 202 may be well connected to the package substrate 1000.

The first and second solder patterns 251 and 252 may be respectively provided bottom surfaces of the first and second pillar patterns 241 and 242. The first and second solder patterns 251 and 252 may be extended to at least partially cover side surfaces of the pillar patterns 241 and 242. The first and second solder patterns 251 and 252 may be formed of or include a material different from those of the first and second conductive patterns 221 and 222. For example, the solder patterns 251 and 252 may be formed of or include tin, lead, silver, or alloys thereof.

The planar arrangement of the bump stacks 201 and 202 will be described with reference to FIG. 1A. When viewed in a plan view, the semiconductor substrate 100 may have first to fourth sides 101, 102, 103, and 104. The first and third sides 101 and 103 of the semiconductor substrate 100 may be opposite to each other and adjacent to the second and fourth sides 102 and 104. The first and third sides 101 and 103 of the semiconductor substrate 100 may be parallel to the first direction x. The second and fourth sides 102 and 104 of the semiconductor substrate 100 may be parallel to the second direction y.

In some embodiments, a plurality of the first bump stacks 201 may be provided on the semiconductor substrate 100. The first bump stacks 201 may be provided on the first surface 100a of the semiconductor substrate 100 and adjacent to the first and third sides 101 and 103. Also, a plurality of the second bump stack 202 may be provided on the semiconductor substrate 100. The second bump stacks 202 may be provided on the first surface 100a of the semiconductor substrate 100 and adjacent to the second and fourth sides 102 and 104. The arrangement of the conductive patterns 221 and 222 may be changed depending on the arrangement of the bump stacks 201 and 202. By controlling the arrangement of the bump stacks 201 and 202, it may be possible to reduce a pitch of the conductive patterns 221 and 222. This may make it possible to scale down the semiconductor package 1.

Long axes of the first pads 211 may be parallel to the first direction x, and long axes of the second pads 212 may be parallel to the second direction y. Spaces between the first and second pads 211 and 212 adjacent to each other may be different from a space between the first pads 211 and from a space between the second pads 212. A space between the pads 211 and 212 may depend on the arrangement of the bump stacks 201 and 202. The first pad 211 and the second pad 212 may be electrically connected to the internal lines 113 of FIG. 3B. By controlling the arrangement of the bump stacks 201 and 202, it may be possible to increase a degree of freedom in placing the internal lines 113 of the circuit layer 110. The planar arrangement of the bump stacks 201 and 202 may not be limited to the examples illustrated in the drawings.

FIGS. 4A to 4G are enlarged sectional views illustrating semiconductor packages according to some embodiments of the disclosure. For concise description, a previously described element may be identified by a similar or identical reference number without repeating an overlapping description thereof. In the following description of FIGS. 4A to 4G, a single pump stack, a single conductive pad, and a single interconnection pattern will be described.

Figure 4A:
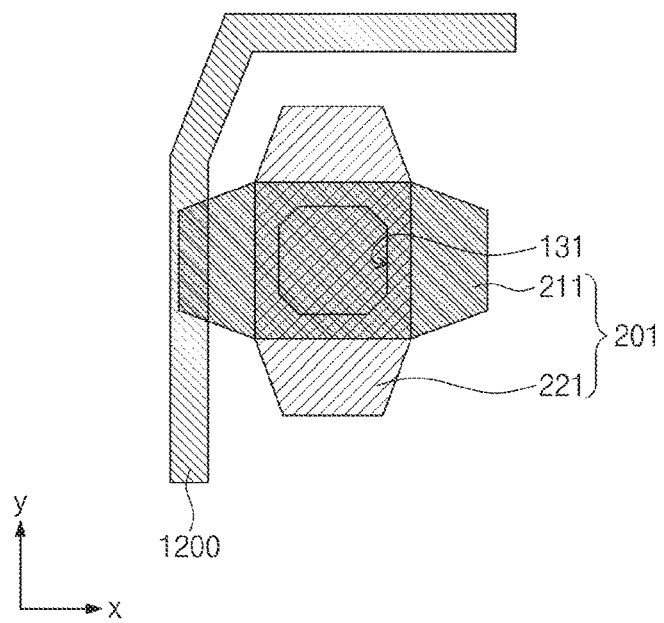
FIGS. 4A to 4G are enlarged sectional views illustrating semiconductor packages according to some embodiments of the disclosure.

Referring to FIGS. 2 and 4A, each of the first pad 211 and the first conductive pattern 221 may have an octagonal section. Each of the first opening 131 of the insulating pattern 120 may have an octagonal section. In the case where the semiconductor device 10 is mounted on the package substrate 1000, the first bump stack 201 may be coupled to the package substrate 1000. When viewed in a plan view, the package substrate 1000 may include an interconnection pattern 1200 that is provided near the first conductive pattern 221. In the case where the first conductive pattern 221 has an octagonal section, it may be possible to prevent or suppress a short circuit from being formed between the first bump stack 201 and the interconnection pattern 1200. Accordingly, it may be possible to increase a degree of freedom in placing the interconnection pattern 1200 and to improve the reliability of the semiconductor package 1. Although not illustrated, at least one of the first pad 211 and the first opening 131 may not have an octagonal section. For example, the first pad 211 may have a tetragonal section, and the first opening 131 of the insulating pattern 120 may have a circular or elliptical section.

Figure 4B:
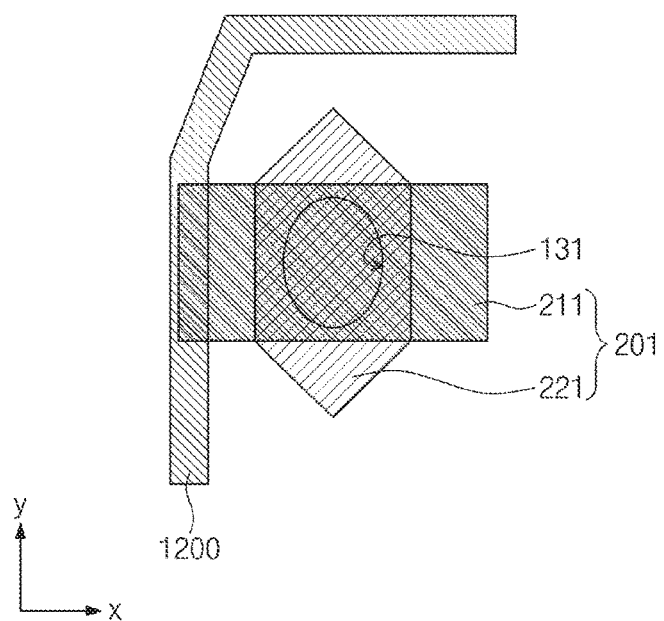

Referring to FIG. 4B in conjunction with FIG. 2, the first conductive pattern 221 may have a hexagonal section. Accordingly, it may be possible to prevent or suppress a short circuit from being formed between the first bump stack 201 and the interconnection pattern 1200 of the package substrate 1000.

Figure 4C:
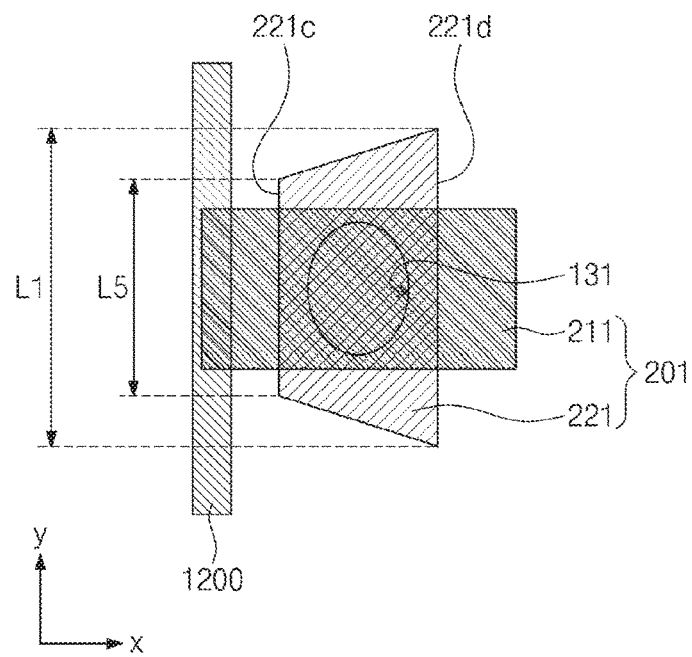
Figure 4D:
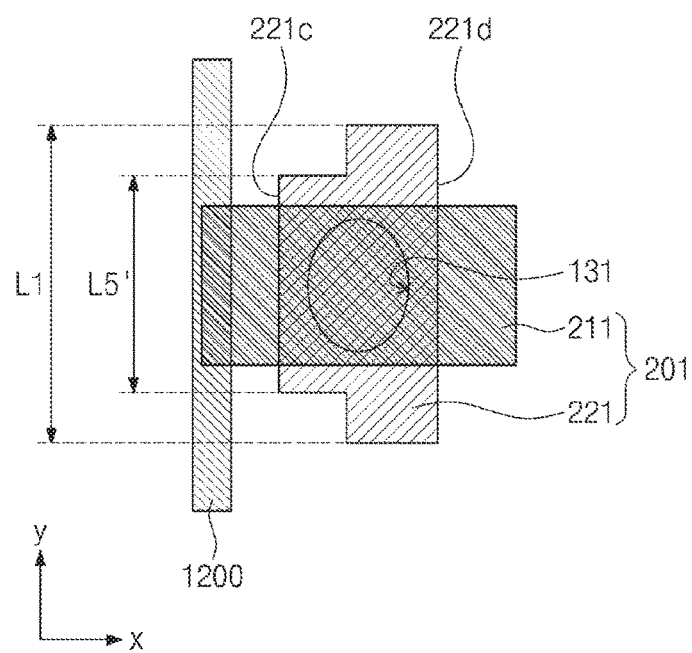

Referring to FIGS. 4C and 4D in conjunction with FIG. 2, the first conductive pattern 221 may have two opposite sides 221c and 221d positioned at different distances from the interconnection pattern 1200. When viewed in a plan view, the interconnection pattern 1200 may be closer to the side 221c of the first conductive pattern 221 than to the other side of 221d, and the side 221c may have a length L5 or L5' that is smaller than the length L1 of the other side 221d. The other side 221d of the first conductive pattern 221 may be substantially the same length as the length L1 of the conductive pattern 221 described with reference to FIGS. 3A to 3C. Accordingly, it may be possible to prevent or suppress a short circuit from being formed between the interconnection pattern 1200 and the first bump stack 201.

Figure 4E:
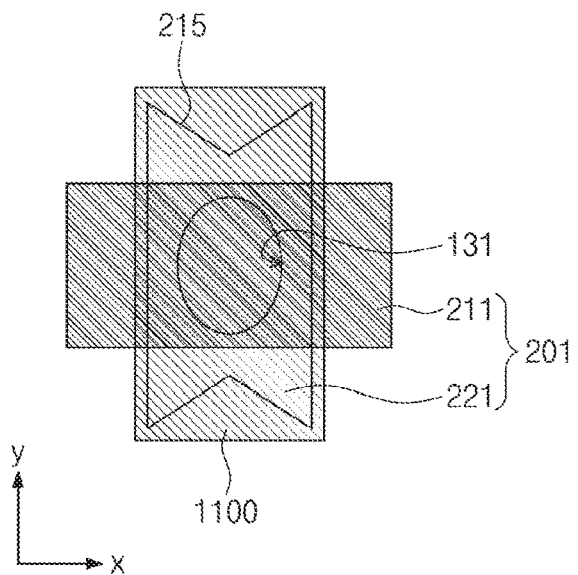
Figure 4F:
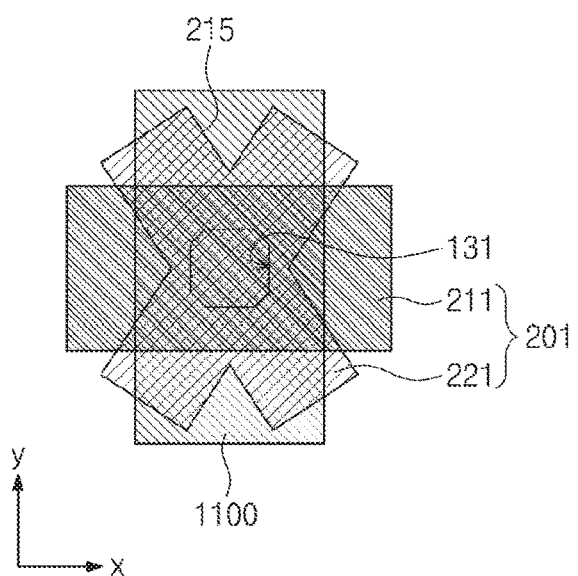

Referring to FIGS. 4E and 4F in conjunction with FIG. 2, the first conductive pattern 221 may be provided to have a recessed region 215, when viewed in a plan view. The recessed region 215 may be overlapped with the conductive pad 1100, when viewed in a plan view. The first solder pattern 251 may have a shape corresponding to the first conductive pattern 221. The first conductive pattern 221 may be coupled to the conductive pad 1100 of the package substrate 1000 via the first solder pattern 251. The first conductive pattern 221 may have the recessed region 215, and the first bump stack 201 (e.g., the first solder pattern 251) may be robustly connected to the interconnection pattern 1200.

Figure 4G:
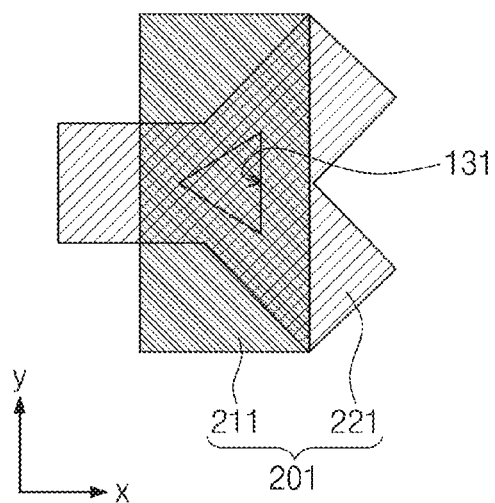

Referring to FIG. 4G, the first conductive pattern 221 may have a polygonal shape. The first opening 131 may have a triangular shape.

Planar shapes of the first pad 211, the first opening 131, and the first conductive pattern 221 may not be limited to the examples illustrated in FIGS. 4A to 4G and may be variously changed. The second pad 212, the second conductive pattern 222, and the second opening 132 may have planar shapes similar to those of the first pad 211, the first conductive pattern 221, and the first opening 131 described with reference to FIGS. 4A to 4G. When the second pad 212, the second conductive pattern 222, and the second opening 132 are rotated by 90 degrees, the second pad 212, the second conductive pattern 222, and the second opening 132 may be provided to have shapes corresponding to the first pad 211, the first conductive pattern 221, and the first opening 131. For the sake of brevity, the conductive pad 1100 of the package substrate 1000 are not illustrated in FIGS. 4A to 4D and 4G, but the conductive pad 1100 of the package substrate 1000 may be provided to be overlapped with the first conductive pattern 221. Also, the interconnection pattern 1200 of the package substrate 1000 are not illustrated in FIGS. 4E to 4G, for the sake of brevity.

Figure 5A:
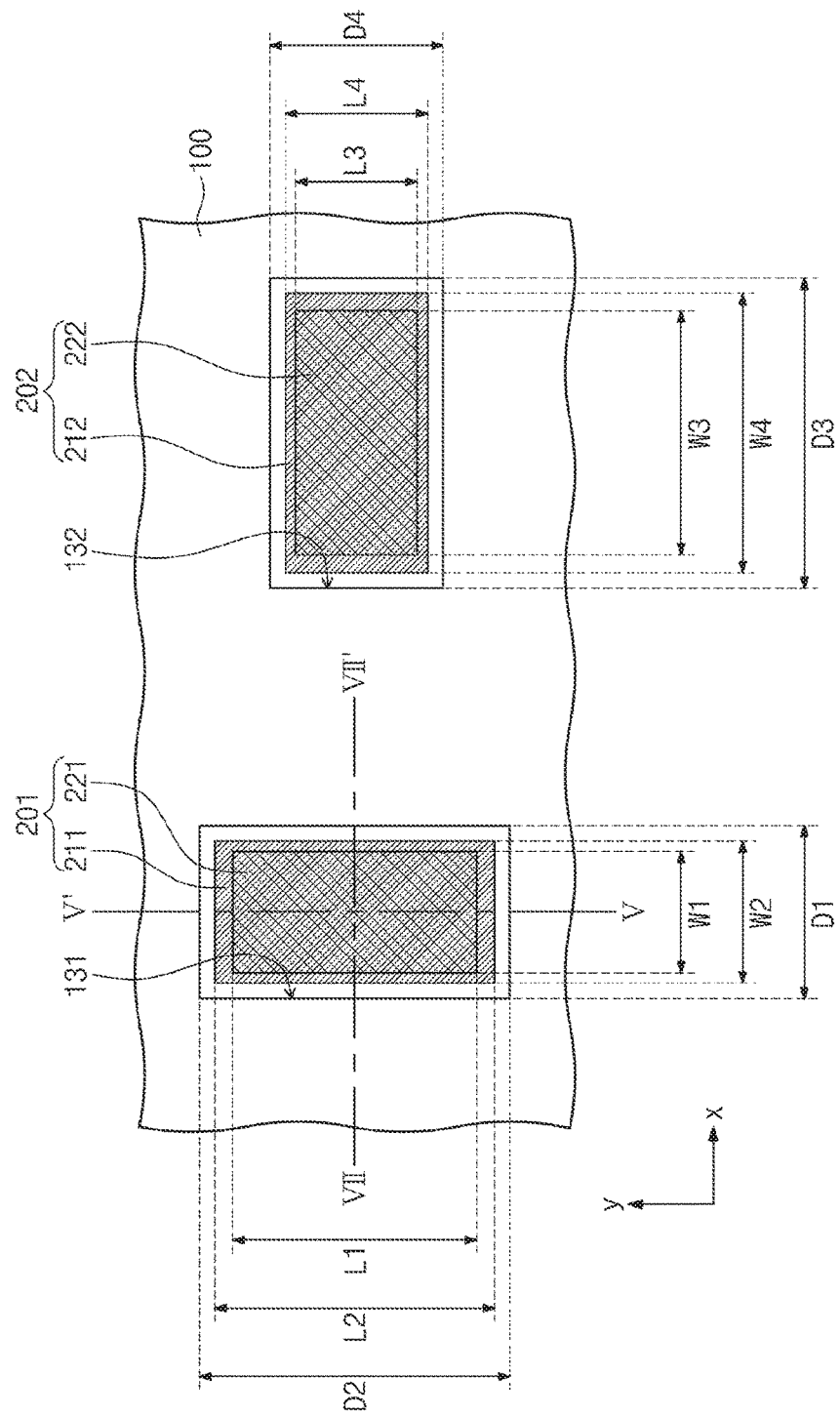
FIG. 5A is a plan view illustrating a semiconductor device according to some embodiments of the disclosure.
Figure 5B:
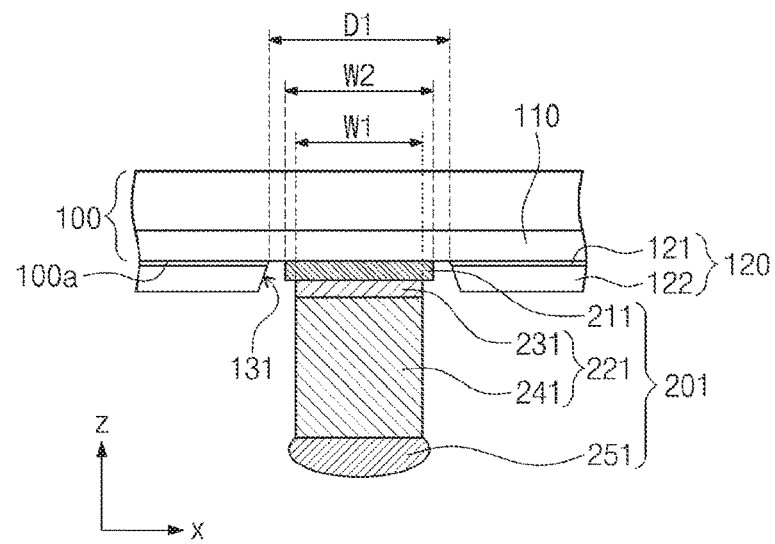
FIG. 5B is a sectional view taken along line VII-VII' of FIG. 5A.
Figure 5C:
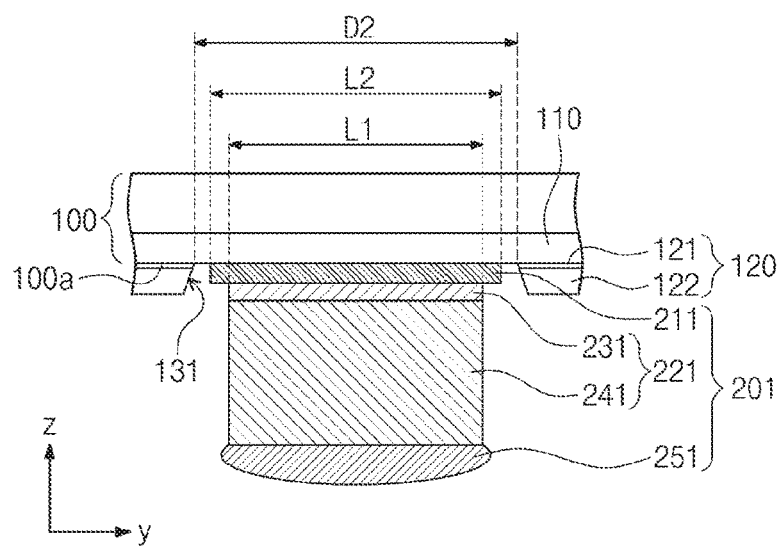
FIG. 5C is a sectional view taken along line V-V' of FIG. 5A.

FIG. 5A is a plan view illustrating a semiconductor device according to some embodiments of the disclosure. For example, FIG. 5A may be a plan view of a region II of FIG. 1A. FIG. 5B is a sectional view taken along line VII-VII' of FIG. 5A. FIG. 5C is a sectional view taken along line V-V' of FIG. 5A. For concise description, a previously described element may be identified by a similar or identical reference number without repeating an overlapping description thereof.

Referring to FIGS. 5A to 5C, the semiconductor device 10 may include the semiconductor substrate 100, the first bump stack 201, and the second bump stack 202. The first conductive pattern 221 and the second conductive pattern 222 may be configured to have substantially the same features as those of FIGS. 1A to 3D. For example, a pattern size of each of the conductive patterns 221 and 222 in its long axis direction may be 1.7-3 times that in its short axis direction.

The insulating pattern 120 may be provided on the first surface 100a of the semiconductor substrate 100. The insulating pattern 120 may have the first opening 131 and the second opening 132. The first and second openings 131 and 132 may have side surfaces that are spaced apart from the pads 211 and 212. The width W2 of the first pad 211 may be less than the pattern size D1 of the first opening 131 in the first direction x. The width W1 of the first conductive pattern 221 may be less than the width W2 of the first pad 211. The length L2 of the first pad 211 may be less than the pattern size D2 of the first opening 131 in the second direction y. The length L1 of the first conductive pattern 221 may be less than the length L2 of the first pad 211.

The width W4 of the second pad 212 may be less than the pattern size D3 of the second opening 132 in the first direction x. The width W3 of the second conductive pattern 222 may be less than the width W4 of the second pad 212. The length L4 of the second pad 212 may be less than the pattern size D4 of the second opening 132 in the second direction y. The length L3 of the second conductive pattern 222 may be less than the length L4 of the second pad 212.

According to some embodiments of the disclosure, a width/length ratio of a conductive pattern may be controlled, and this may make it possible to improve electric characteristics of a connection structure connecting a bump stack to a semiconductor substrate or to a package substrate. Two opposite ends of a pad may not be overlapped with the conductive pattern and the pad may have an increased occupying area. Two opposite sides of the conductive pattern may not be overlapped with the pad and the conductive pattern may have an increased occupying area. This may make it possible to realize a good electric connection structure between a semiconductor device and the package substrate. In some embodiments, a semiconductor device can be scaled down.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While example embodiments of the disclosure have been particularly shown and described, it will be understood by one of ordinary skill in the art that variations in form and detail may be made therein without departing from the spirit and scope of the attached claims.

What is claimed is:

1. A semiconductor device, comprising:
a semiconductor chip;
a pad provided on the semiconductor chip;
an insulating pattern provided on the semiconductor chip, the insulating pattern having an opening exposing the pad; and
a conductive pattern provided on the insulating pattern, wherein:
the pad has two opposite ends that are spaced apart from the conductive pattern, when viewed in a plan view,
the conductive pattern has two opposite ends that are spaced apart from the pad,
a pattern size of the conductive pattern in a direction of its length is 1.7-3 times that in a direction of its width, and
a pattern size of the opening in a width direction is less than a width of the pad, and a pattern size of the opening in a length direction is less than a length of the pad.

2. The device of claim 1, wherein:
the length of the conductive pattern is 110%-150% of the length of the pad, and
the width of the pad is 110%-150% of the width of the conductive pattern.

3. The device of claim 1, further comprising:
multiple pairs of the pad and the conductive pattern, wherein:
a length of one of the conductive patterns is parallel to a first direction,
a length of another of the conductive patterns is parallel to a second direction, and
the first and second directions are oblique to each other.

4. The device of claim 1, wherein:
the conductive pattern has an octagonal planar shape, and
the opening has an octagonal planar shape.

5. The device of claim 1, further comprising a solder pattern of the conductive pattern, wherein the solder pattern contains a material different from that of the conductive pattern.

6. A semiconductor device, comprising:
a substrate;
a first bump stack provided on a surface of the substrate, the first bump stack comprising a first pad and a first pillar pattern on the first pad; and
a second bump stack provided on the surface of the substrate, the second bump stack comprising a second pad and a second pillar pattern on the second pad; and
an insulating pattern that is provided on the surface of the substrate and which has a first opening and a second opening, wherein:
a width of the first pad is larger than a width of the first pillar pattern,
a length of the first pillar pattern is larger than a length of the first pad,
a width of the second pillar pattern is larger than a width of the second pad,
width directions of the first and second pillar patterns are parallel to a first direction,
the first pad has two opposite ends that are spaced apart from the first pillar pattern, when viewed in a plan view,
the first opening is provided to expose the first pad,
the second opening is provided to expose the second pad,
a width of the first opening is less than the width of the first pad and the width of the first pillar pattern, and
a length of the first opening is less than the length of the first pad and the length of the first pillar pattern.

7. The device of claim 6, wherein a length of the second pad is larger than a length of the second pillar pattern.

8. The device of claim 7, wherein:
the width of the first pad is 110%-150% of the width of the first pillar pattern,
the length of the first pillar pattern is 110%-150% of the length of the first pad,
the width of the second pillar pattern is 110%-150% of the width of the second pad, and
the length of the second pad is 110%-150% of the length of the second pillar pattern.

9. The device of claim 6, wherein the length of the first pillar pattern is 1.7-3 times the width of the first pillar pattern.

10. The device of claim 6, wherein the width of the second pillar pattern is substantially equal to the length of the first pillar pattern.

11. The device of claim 6, wherein, when viewed in a plan view, the first and second pillar patterns are provided to be adjacent to first and second sides, respectively, of the substrate, and the first and second sides of the substrate are adjacent to each other.

12. The device of claim 6, wherein the substrate comprises a circuit layer, and
the first pad and the second pad are electrically connected to the circuit layer.

13. A semiconductor device, comprising:
a semiconductor chip;
pads provided on the semiconductor chip;
insulating patterns provided on the semiconductor chip, the insulating patterns having openings exposing the pads; and
conductive patterns provided in the openings and coupled to the pads, wherein:
two opposite ends of the pads are spaced apart from the conductive patterns, when viewed in a plan view,
two opposite ends of the conductive patterns are spaced apart from the pads,
the conductive patterns comprise a first conductive pattern whose long axis is parallel to a first direction and a second conductive pattern whose long axis is parallel to a second direction, when viewed in the plan view, the first and second directions are oblique to each other, a width of the first opening is less than the width of the first pad and the width of the first conductive pattern, and a length of the first opening is less than the length of the first pad and the length of the first conductive pattern.

14. The device of claim 13, wherein pattern sizes of the conductive patterns in a direction of their long axes are 1.7-3 times those in a direction of their short axes.

15. The device of claim 13, wherein the conductive patterns comprise:

under-bump patterns coupled to the pads; and pillar patterns provided on the under-bump patterns.

16. The device of claim 13, further comprising:

a package substrate, wherein:

the conductive patterns are provided between the semiconductor chip and the package substrate, and the semiconductor chip is electrically connected to the package substrate via the conductive patterns.

* * * * *